United States Patent
Takahashi et al.

(10) Patent No.: US 10,917,967 B2
(45) Date of Patent: Feb. 9, 2021

(54) PRINTED WIRING BOARD AND METHOD FOR MANUFACTURING PRINTED WIRING BOARD

(71) Applicant: SUMITOMO ELECTRIC INDUSTRIES, LTD., Osaka (JP)

(72) Inventors: Kenji Takahashi, Osaka (JP); Eiko Imazaki, Osaka (JP); Koji Nitta, Osaka (JP); Shoichiro Sakai, Osaka (JP); Kousuke Miura, Osaka (JP); Masahiro Matsumoto, Osaka (JP); Hirohisa Saito, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/977,586

(22) PCT Filed: Mar. 6, 2019

(86) PCT No.: PCT/JP2019/008736
§ 371 (c)(1),
(2) Date: Sep. 2, 2020

(87) PCT Pub. No.: WO2019/216011
PCT Pub. Date: Nov. 14, 2019

(65) Prior Publication Data
US 2020/0413537 A1  Dec. 31, 2020

(30) Foreign Application Priority Data
May 7, 2018 (JP) .................................. 2018-089178

(51) Int. Cl.
H05K 1/11 (2006.01)
H05K 3/42 (2006.01)

(52) U.S. Cl.
CPC ............... *H05K 1/115* (2013.01); *H05K 3/42* (2013.01); *H05K 2201/09545* (2013.01)

(58) Field of Classification Search
CPC . H05K 1/115; H05K 3/42; H05K 2201/09545
(Continued)

(56) References Cited

U.S. PATENT DOCUMENTS 5,863,446 A * 1/1999 Hanson ................ H05K 3/4638
216/16
7,205,230 B2 * 4/2007 Mashino .................. H05K 3/22
438/622
(Continued)

FOREIGN PATENT DOCUMENTS

JP 2004-311919 11/2004
JP 2010-245517 10/2010
(Continued)

*Primary Examiner* — Sherman Ng
(74) *Attorney, Agent, or Firm* — IPUSA, PLLC

(57) ABSTRACT

A printed wiring board includes an insulator having a first surface, and a second surface opposite to the first surface, a through-hole penetrating from the first surface to the second surface, and a metal plated layer formed on the first and second surfaces of the insulator, and on an inner peripheral surface of the through-hole, wherein an inside diameter of the through-hole gradually decreases from the first surface toward the second surface of the insulator. An average diameter of the through-hole is 20 μm or greater and 35 μm or less at the first surface, and is 3 μm or greater and 15 μm or less at the second surface, and an average thickness of the metal plated layer formed on the first and second surfaces is 8 μm or greater and 12 μm or less.

2 Claims, 1 Drawing Sheet

(58) Field of Classification Search
USPC .......................................................... 174/262
See application file for complete search history.

(56) References Cited

U.S. PATENT DOCUMENTS

| | | | |
|---|---|---|---|
| 2003/0102223 A1* | 6/2003 | Shimo | .................... H05K 3/423 |
| | | | 205/125 |
| 2006/0289203 A1* | 12/2006 | Oda | ..................... H05K 3/4069 |
| | | | 174/264 |
| 2009/0084588 A1* | 4/2009 | Sekine | .................. H01L 23/481 |
| | | | 174/257 |
| 2010/0243311 A1 | 9/2010 | Niki et al. | |
| 2013/0025120 A1 | 1/2013 | Hondo | |
| 2015/0034378 A1* | 2/2015 | Kajihara | ................ H05K 3/427 |
| | | | 174/266 |
| 2017/0318674 A1 | 11/2017 | Kaibuki et al. | |

FOREIGN PATENT DOCUMENTS

| | | |
|---|---|---|
| JP | 2017-011247 | 1/2017 |
| WO | 2004/103039 | 11/2004 |
| WO | 2011/096539 | 8/2011 |
| WO | 2016/063799 | 4/2016 |

\* cited by examiner

PRINTED WIRING BOARD AND METHOD FOR MANUFACTURING PRINTED WIRING BOARD

TECHNICAL FIELD

The present disclosure relates to a printed wiring board and a method for manufacturing the printed wiring board.

This application is based upon and claims priority to Japanese Patent Application No. 2018-89178, filed on May 7, 2018, the entire contents of which are incorporated herein by reference.

BACKGROUND ART

In recent years, the wirings of the printed wiring board have been refined, and there are demands to reduce the thickness of the printed wiring board and to reduce the size of through-holes provided in the printed wiring board.

Generally, the through-hole is formed by performing an electroless plating on an inner peripheral surface of the through-hole formed in a base insulator, and performing electroplating on an adherend, electroless plated layer that is formed by the electroless plating. In electroplating, a plating current tends to concentrate at fringe portions formed between the inner peripheral surface of the through-hole and upper and lower surfaces of the insulator, and cause a plating thickness at the fringe portions to be larger than thicknesses at other portions. For this reason, when a diameter of the through-hole is reduced, the opening of the through-hole is closed by a metal plated layer before the metal sufficiently fills the inside of the through-hole, and causes an inconvenience in that a void (space not filled with the metal) is formed in the inside of the through-hole.

On the other hand, a technique has been proposed to form the through-hole into a drum shape (a shape in which two conical surfaces are combined so that the diameter becomes smaller at the center portion) having a diameter that increases from a center portion toward the upper and lower surfaces of the insulator along a thickness direction of the insulator, so that the through-hole is successively closed from the center portion along the thickness direction due to the plated metal that fills the through-hole (refer to Japanese Laid-Open Patent Publication No. 2004-311919).

PRIOR ART DOCUMENTS

Patent Document

Patent Document 1: Japanese Laid-Open Patent Publication No. 2004-311919

DISCLOSURE OF THE INVENTION

A printed wiring board according to one aspect of the present disclosure includes an insulator having a first surface, and a second surface opposite to the first surface, and including a through-hole penetrating from the first surface to the second surface; and a metal plated layer formed on the first surface and the second surface of the insulator, and on an inner peripheral surface of the through-hole, wherein an inside diameter of the through-hole gradually decreases from the first surface toward the second surface of the insulator, wherein an average diameter of the through-hole at the first surface of the insulator is 20 μm or greater and 35 μm or less, wherein the average diameter of the through-hole at the second surface of the insulator is 3 μm or greater and 15 μm or less, and wherein an average thickness of the metal plated layer formed on the first surface and the second surface of the insulator is 8 μm or greater and 12 μm or less.

In addition, a method for manufacturing a printed wiring board according to one aspect of the present disclosure includes a process of forming, in an insulator having a first surface, and a second surface opposite to the first surface, a through-hole penetrating from the first surface to the second surface; and a process of forming a metal plated layer on the first surface and the second surface of the insulator, and on an inner peripheral surface of the through-hole, wherein the process of forming the through-hole includes gradually decreasing an inside diameter of the through-hole from the first surface toward the second surface of the insulator, forming the through-hole to have an average diameter of 20 μm or greater and 35 μm or less at the first surface of the insulator, and foisting the through-hole to have the average diameter of 3 μm or greater and 15 μm or less at the second surface of the insulator, and wherein the process of forming the metal plated layer forms the metal plated layer on the first surface and the second surface of the insulator to have an average thickness of 8 μm or greater and 12 μm or less.

MODE OF CARRYING OUT THE INVENTION

Figure 1:
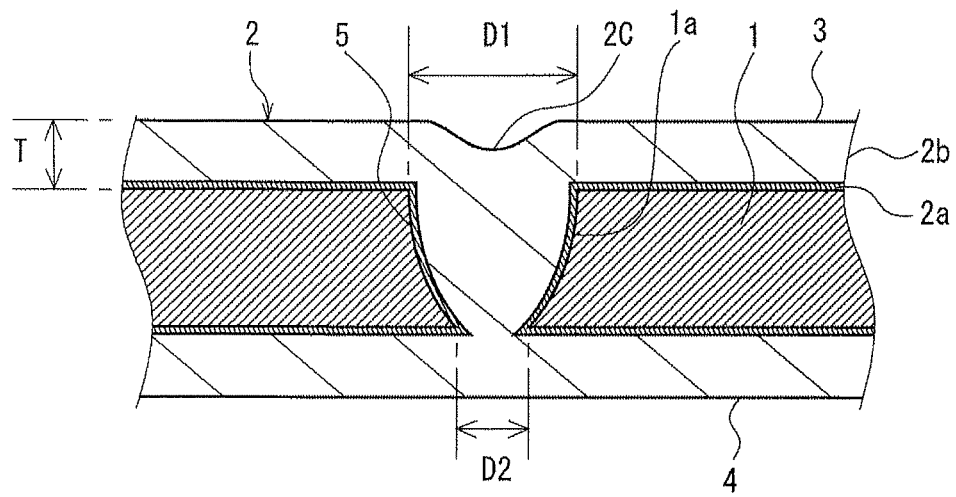
FIG. 1 is a schematic cross sectional view illustrating a main portion of a printed wiring board according to one embodiment of the present disclosure.

Problems to be Solved by the Present Disclosure

When the concentration of the plating current, at the fringe portions formed between the inner peripheral surface of the through-hole and upper and lower surfaces of the insulator, is taken into consideration, a tapered angle of the through-hole needs to be increased to a certain extent. For this reason, in a case where the structure described in the above described publication is applied to a flexible printed wiring board, a stress is easily concentrated at an edge formed on the inner peripheral surface of the through-hole at the center portion of the insulator along the thickness direction thereof, when a bending stress is applied to the flexible printed wiring board, to thereby easily generate cracks around the edge. As a result, durability and conductivity of the printed wiring board may become insufficient.

The present disclosure is conceived in view of the above described circumstances, and it is one object to provide a printed wiring board and a method for manufacturing the printed wiring board, that can prevent the generation of the void inside the through-hole, while reducing deterioration of the durability and the conductivity.

Effects of the Present Disclosure

The printed wiring board according to one aspect of the present disclosure can prevent the generation of the void inside the through-hole, while reducing the deterioration of the durability and the conductivity. The method for manufacturing the printed wiring board according to another aspect of the present disclosure can manufacture a printed wiring board in which the deterioration of the durability and the conductivity is reduced, and the generation of the void is prevented.

DESCRIPTION OF EMBODIMENTS OF THE PRESENT DISCLOSURE

First, aspects of the present disclosure will be described in the following.

A printed wiring board according to one aspect of the present disclosure, in order to solve the above described problem, includes an insulator having a first surface, and a second surface opposite to the first surface, and including a through-hole penetrating from the first surface to the second surface; and a metal plated layer formed on the first surface and the second surface of the insulator, and on an inner peripheral surface of the through-hole, wherein an inside diameter of the through-hole gradually decreases from the first surface toward the second surface of the insulator, wherein an average diameter of the through-hole at the first surface of the insulator is 20 μm or greater and 35 μm or less, wherein the average diameter of the through-hole at the second surface of the insulator is 3 μm or greater and 15 μm or less, and wherein an average thickness of the metal plated layer formed on the first surface and the second surface of the insulator is 8 μm or greater and 12 μm or less.

According to the printed wiring board, since the inside diameter of the through-hole penetrating the insulator gradually decreases from the first surface toward the second surface of the insulator, and the average diameter of the through-hole at the first surface and the second surface insulator, and the average thickness of the metal plated layer formed on both sides of the insulator, respectively fall within the above-described ranges, the plating metal can successively fill the through-hole from the second surface side when performing the electroplating, after closing an end portion of the through-hole at the second surface side, while preventing the formation of voids. Because the average diameter of the through-hole at the first surface and the second surface of the insulator falls within the above-described range, it is possible in this printed wiring board to reduce the stress concentration at the fringe portions of the inner peripheral surface of the through-hole. Accordingly, the printed wiring board can reduce the generation of voids while reducing the deterioration of the durability and the conductivity.

Preferably, the metal plated layer fills an inside of the through-hole, and a surface of the metal plated layer caves in on the first surface side of a region where the metal plated layer fills the through-hole. As described above, the metal plated layer fills the through-hole, and because the surface of the metal plated layer caves in on the first surface side of the region where the metal plated layer fills the through-hole, it is possible to easily and positively prevent the generation of voids in the metal plated layer.

The inner peripheral surface of the through-hole preferably curves radially outward in a convex arc shape, in a cross section of the insulator along a thickness direction thereof. Because the inner peripheral surface of the through-hole curves radially outward in the convex arc shape, in the cross section of the insulator along the thickness direction thereof, it is possible to easily fill the through-hole with the plating metal while preventing the generation of voids.

A method for manufacturing a printed wiring board according to another aspect of the present disclosure, in order to solve the above-described problem, includes a process of forming, in an insulator having a first surface, and a second surface opposite to the first surface, a through-hole penetrating from the first surface to the second surface; and a process of forming a metal plated layer on the first surface and the second surface of the insulator, and on an inner peripheral surface of the through-hole, wherein the process of forming the through-hole includes gradually decreasing an inside diameter of the through-hole from the first surface toward the second surface of the insulator, forming the through-hole to have an average diameter of 20 μm or greater and 35 μm or less at the first surface of the insulator, and forming the through-hole to have the average diameter of 3 μm or greater and 15 μm or less at the second surface of the insulator, and wherein the process of forming the metal plated layer forms the metal plated layer on the first surface and the second surface of the insulator to have an average thickness of 8 μm or greater and 12 μm or less.

According to the method for manufacturing the printed wiring board, in the process of forming the through-hole, the inside diameter of the through-hole is gradually decreased from the first surface toward the second surface of the insulator, while controlling the average diameter of the through-hole at the first surface and the second surface of the insulator to fall within the above-described range. In addition, according to the method for manufacturing the printed wiring board, in the process of forming the plated metal layer, the average thickness of the metal plated layer formed on the first surface and the second surface of the insulator is controlled within the above-described range. In the method for manufacturing the printed wiring board, by setting the average diameter of the through-hole at the first surface and the second surface of the insulator, and the average thickness of the metal plated layer formed on the first surface and the second surface of the insulator, to fall within the above-described ranges, the plated metal layer can successively fill the through-hole from the second surface side when performing the process of forming the metal plated layer, after closing the end portion of the through-hole at the second surface side, while preventing the formation of voids. In the method for manufacturing the printed wiring board, by setting the average diameter of the through-hole at the first surface and the second surface of the insulator to fall within the above-described range, it is possible to reduce the stress concentration at the fringe portions of the inner peripheral surface of the through-hole. Accordingly, the method for manufacturing the printed wiring board can manufacture a printed wiring board in which the deterioration of the durability and the conductivity is reduced, and the generation of voids inside the through-hole is prevented.

In the present disclosure, "average diameter" refers to a diameter of a perfect circle when the circle is converted into the perfect circle of equal area. In addition, an "average thickness" refers to an average value of thicknesses at 10 arbitrary points. For the sake of convenience, the "first surface" of the insulator refers to the side where the inside diameter of the through-hole is larger between the two sides of the insulator, and the "second surface" refers to the opposite side from the first surface, however, these designations are not intended to limit the orientation of the printed wiring board during manufacture or use. Hereinafter, the "first surface" may also be referred to as the "upper surface", and the "second surface" may also be referred to as the "lower surface". Moreover, a "thickness direction" of the insulator refers to the direction from the first surface toward the second surface of the insulator.

Details of Embodiments of the Present Disclosure

Next, the printed wiring board and the method for manufacturing the printed wiring board according to one embodiment of the present disclosure will be described in detail, with reference to the drawings.

Printed Wiring Board

A printed wiring board illustrated in FIG. 1 includes an insulator 1 having a through-hole 1a, and a metal plated layer 2 formed on both sides of the insulator 1 and on an inner peripheral surface of the through-hole 1a. The inside diameter of the through-hole 1a in the printed wiring board gradually decreases from the upper surface (first surface) toward the lower surface (second surface) of the insulator 1. The average diameter of the through-hole 1a at the upper surface (first surface) of the insulator 1 is 20 μm or greater and 35 μm or less, the average diameter of the through-hole 1a at the lower surface (second surface) of the insulator 1 is 3 μm or greater and 15 μm or less, and the average thickness of the metal plated layer 2 formed on both sides of the insulator 1 is 8 μm or greater and 12 μm or less.

Since the inside diameter of the through-hole 1a penetrating the insulator 1 gradually decreases from the upper surface toward the lower surface of the insulator 1 in the printed wiring board, and the average diameter of the through-hole 1a at the upper and lower surfaces of the insulator 1, and the average thickness of the metal plated layer 2 formed on both sides of the insulator 1 respectively fall within the above-described ranges, the plating metal can successively fill the through-hole 1a from the lower surface side when performing the electroplating, after closing the end portion of the through-hole 1a at the lower surface side, while preventing the formation of voids. Because the average diameter of the through-hole 1a at the upper and lower surfaces of the insulator 1 falls within the above-described range, it is possible in this printed wiring board to reduce the stress concentration at the fringe portions of the inner peripheral surface of the through-hole 1a (more particularly, at the fringe portion of the inner peripheral surface of the through hole 1a at the lower surface side of the insulator 1). Accordingly, the printed wiring board can reduce the generation of voids while reducing the deterioration of the durability and the conductivity.

Insulator

The insulator 1 is a plate-shaped, a sheet-shaped, or a film-shaped base having insulating properties. The insulator 1 is the base that supports the metal plated layer 2. The insulator 1 is preferably flexible. In other words, the printed wiring board is preferably a flexible printed wiring board that is flexible. As described above, the printed wiring board is sufficiently durable even when it is used in a bent state, because the stress concentration at the fringe portions of the inner peripheral surface of the through-hole 1a can be reduced as described above.

The insulator 1 may be formed by a resin composition including a synthetic resin as a main component thereof. Examples of the synthetic resin forming the main component of the insulator 1 include polyamides, polyimides, polyamide-imides, polyesters, liquid crystal polymers, fluororesins, or the like. From a viewpoint of heat resistance and mechanical strength, polyamides, polyimides, and polyamide-imides in particular are preferably used as the synthetic resin. The term "main component" refers to a component having the highest content in terms of mass, and is a component having a content that is 50 mass % or higher, and preferably 80 mass % or higher, for example.

A lower limit of the average thickness of the insulator 1 is preferably 10 μm, and more preferably 20 μm. On the other hand, an upper limit of the average thickness of the insulator 1 is preferably 500 μm, more preferably 150 μm, and even more preferably 50 μm. When the average thickness of the insulator 1 is less than the above described lower limit, the strength of the insulator 1 may become insufficient. On the other hand, when the average thickness of the insulator 1 exceeds the upper limit described above, the flexibility of the printed wiring board may become insufficient. Since the printed wiring board is configured so that the inside diameter of the through-hole 1a gradually decreases from the upper surface toward the lower surface of the insulator 1 as described above, by setting the average thickness of the insulator 1 to fall within the above described range, it is possible to sufficiently reduce the stress concentration at the fringe portions of the inner peripheral surface of the through-hole 1a.

Through-Hole

The through-hole 1a penetrates the insulator 1 along the thickness direction thereof. A center axis of the through-hole 1a is parallel to the thickness direction of the insulator 1. The inside diameter of the through-hole 1a gradually decreases from the upper surface toward the lower surface of the insulator 1 as described above. Preferably, a portion parallel to the thickness direction of the insulator 1 is not formed on the inner peripheral surface of the through-hole 1a. That is, the diameter of the through-hole 1a preferably decreases continuously the upper surface toward the lower surface of the insulator 1. In the printed wiring board, since the diameter of the through-hole 1a is made to continuously decrease from the upper surface toward the lower surface of the insulator 1, an angle at which the diameter of the through-hole 1a decreases (an inclination angle of the through-hole 1a with respect to a planar direction of the insulator 1) can be prevented from partially becoming too large, and the stress concentration at the inner peripheral surface of the through-hole 1a can more easily be reduced.

A cross sectional shape of the through-hole 1a along a direction perpendicular to the center axis of the through-hole 1a is not particularly limited, but is preferably a circular shape. In other words, the overall shape of the through-hole 1a is preferably a truncated cone shape having a diameter that decreases from the upper surface toward the lower surface of the insulator 1.

In the cross section along the thickness direction of the insulator 1, the inner peripheral surface of the through-hole 1a preferably curves radially outward in a convex arc shape. In the printed wiring board, because the inner peripheral surface of the through-hole 1a curves radially outward in the convex arc shape in the cross section along the thickness direction of the insulator 1, the plating metal can more easily fill the inside of the through-hole 1a, while preventing the generation of voids. More particularly, when the inner peripheral surface of the through-hole 1a curves radially outward in the convex arc shape in the cross section along the thickness direction of the insulator 1, the diameter of the through-hole 1a at the upper surface side of the insulator 1 tends to generally become large along an axial direction. For this reason, according to this configuration, a dome-shaped cave-in portion 2c, which will be described later, is easily formed at the surface of a region where the metal plated layer 2 fills the through-hole 1a on the upper surface (first surface) side. In this configuration of the printed wiring board, because the dome-shaped cave-in portion 2c is easily formed in the case where the plating metal fills the through-hole 1a from the lower surface side and the inner peripheral side of the through-hole 1a, voids are unlikely generated in the region of the metal plated layer 2 filling the through-hole 1a when the cave-in portion 2c is formed.

The lower limit of an average diameter D1 of the through-hole 1a at the upper surface (first surface) of the insulator 1 is 20 μm as described above, and is preferably 25 μm. On the other hand, the upper limit of the average diameter D1 is 35 μm as described above, and is preferably 30 μm. When the average diameter D1 is less than the above described lower limit, the upper surface side of the through-hole 1a may become closed by the plating metal before the plating metal fills the through-hole 1a from the lower surface side. On the other hand, when the average diameter D1 exceeds the above described upper limit, it may not be possible to sufficiently promote reduction of the wirings of the printed wiring board.

The lower limit of an average diameter D2 of the through-hole 1a at the lower surface (second surface) of the insulator 1 is 3 μm as described above, and is preferably 5 μm. On the other hand, the upper limit of the average diameter D2 is 15 μm as described above, and is preferably 10 μm. When the average diameter D2 is less than the above described lower limit, the cross sectional area of the through-hole 1a at the lower surface side of the insulator 1 may become too small, and the connection of the metal plated layer 2 may become uncertain thereat. On the other hand, when the average diameter D2 exceeds the above described upper limit, it may become difficult to sufficiently enlarge the diameter of the through-hole 1a from the lower surface side to the upper surface side of the insulator 1, and voids may be generated in the region of the metal plated layer 2 filling the through-hole 1a, or the average diameter D1 of the through-hole 1a at the upper surface (first surface) of the insulating layer 1 may become too large such that it may not be possible to sufficiently promote reduction of the wirings of the printed wiring board.

A lower limit of a ratio of a difference (D1-D2) between the average diameters of the through-hole 1a at the upper and lower surfaces of the insulator 1 with respect to the average thickness of the insulator 1, is preferably 0.5, and more preferably 0.7. On the other hand, an upper limit of the above described ratio is preferably 1.2, and more preferably 1.0. When the ratio is less than the above described lower limit, the diameter of the through-hole 1a cannot be sufficiently enlarged from the lower surface side to the upper surface side of the insulator 1, and voids may be generated in the region of the metal plated layer 2 filling the through-hole 1a. On the other hand, when the ratio exceeds the above described upper limit, the average diameter D1 of the through-hole 1a at the upper surface (first surface) of the insulator 1 may become too large, and it may not be possible to sufficiently promote reduction of the wirings of the printed wiring board, or the average diameter D2 of the through-hole 1a at the lower surface of the insulator 1 may become too small, and the connection of the metal plated layer 2 on the lower surface side of the insulator 1 may become uncertain thereat.

A method of forming the through-hole 1a may include, laser beam machining, drilling, or the like, for example, and the laser beam machining, which can form the fine through-hole 1a with a high precision, may preferably be used to form the through-hole 1a.

Metal Plated Layer

The metal plated layer 2 is formed by integrally forming a first metal layer 3 on the upper surface (first surface) of the insulator 1, a second metal layer 4 on the lower surface (second surface) of the insulator 1, and a through-hole 5 connecting the first metal layer 3 and the second metal layer 4.

The metal plated layer 2 is filled into the through-hole 1a. Preferably, the first surface of the region where the metal plated layer 2 fills the through-hole 1a caves in. In other words, a cave-in portion 2c is preferably formed on the first surface side surface of the region where the metal plated layer 2 fills the through-hole 1a. The cave-in portion 2 has a dome shape with a bottom portion on the center axis of the through-hole 1a, for example. In the printed wiring board, the first surface side of the region where the metal plated layer 2 fills the through-hole 1a caves in, so that the generation of voids in the metal plated layer 2 is easily and positively prevented.

The metal plated layer 2 may have a structure that includes a conductive electroless plated layer 2a formed on both sides of the insulator 1 and on the inner peripheral surface of the through-hole 1a, and an electroplated layer 2b laminated on the electroless plated layer 2a.

The lower limit of an average thickness T of the metal plated layer 2 formed on both sides of the insulator 1 is 8 μm as described above, and is preferably 9 μm. On the other hand, the upper limit of the average thickness T is 12 μm as described above, and is preferably 11 μm. When the average thickness T is less than the above described lower limit, the strength of the metal plated layer 2 may become insufficient. On the other hand, when the average thickness T exceeds the above described upper limit, it may not be possible to sufficiently reduce the wirings formed by the metal plated layer 2.

Electroless Plated Layer

The electroless plated layer 2a is a thin metal layer formed by an electroless plating, and is used as an adherend (cathode) when forming the electroplated layer 2b by electroplating.

Examples of the material forming the electroless plated layer 2a include metals, such as copper, silver, nickel, palladium, or the like, and copper is particularly preferable from a viewpoint of low cost, excellent flexibility, and low electrical resistance thereof.

The electroless plating, which forms the electroless plated layer 2a, is a process of depositing the metal having catalytic activity due to catalytic reduction, and may be performed by coating various commercially available electroless plating solutions.

A lower limit of the average thickness of the electroless plated layer 2a is preferably 0.05 μm, and more preferably 0.10 μm. On the other hand, an upper limit of the average thickness of the electroless plated layer 2a is preferably 0.7 μm, and more preferably 0.5 μm. When the average thickness of the electroless plated layer 2a is less than the above described lower limit, an increase in an electrical resistance of the electroless plated layer 2a may cause insufficient deposition of the plating metal on the electroless plated layer 2a during electroplating. On the other hand, when the average thickness of the electroless plated layer 2a exceeds the above described upper limit, the electroless plated layer 2a and thus the printed wiring board may become unnecessarily expensive.

Electroplated Layer

The electroplated layer 2b is formed by laminating a plating metal on the electroless plated layer 2a by electroplating, using the electroless plated layer 2a as the cathode. The electroplated layer 2b completely fills the internal space of the through-hole 1a on the electroless plated layer 2a.

Examples of the plating metal that forms the electroplated layer 2b include copper, nickel, gold, or the like, and copper is particularly preferable from a viewpoint of low cost and low electrical resistance thereof.

A thickness of the electroplated layer 2b is selected so that the thickness of the metal plated layer 2 becomes a desired thickness, by adjusting electroplating conditions, such as a composition of the plating solution, a plating current, a plating time, or the like, for example.

The electroplating that forms the electroplated layer 2b may be performed by laminating a resist pattern having openings corresponding to the desired wiring pattern on an outer surface of the electroless plated layer 2a. In this case, the electroplated layer 2b can be laminated only on exposed portions of the electroless plated layer 2a corresponding to the openings in the resist pattern. Thereafter, the resist pattern is removed after forming the electroplated layer 2b, and by etching and removing portions of the electroless plated layer 2a where the electroplated layer 2b is not laminated, it is possible to form the metal plated layer 2 that is patterned to the desired wiring pattern.

Method For Manufacturing Printed Wiring Board

Figure 2:
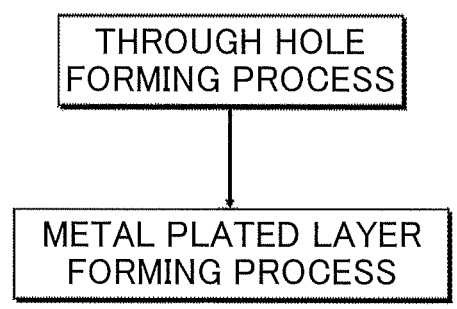
FIG. 2 is a flow diagram illustrating a method for manufacturing the printed wiring board according to one embodiment of the present disclosure.

Next, an example of a method for manufacturing the printed wiring board illustrated in FIG. 1 will be described, with reference to FIG. 2. The method for manufacturing the printed wiring board includes a process (through-hole forming step) of forming the through-hole 1a in the insulator 1, and a process (metal plated layer forming step) of forming the metal plated layer 2 on both sides of the insulator 1 and on the inner peripheral surface of the through-hole 1a after the through-hole forming step. In the method for manufacturing the printed wiring board, the inside diameter of the through-hole 1a is gradually decreased from the upper surface (first surface) toward the lower surface (second surface) of the insulator 1 in the above described through-hole forming step. The average diameter of the through-hole 1a at the upper surface (first surface) of the insulator 1 is 20 μm or greater and 35 μm or less, and the average diameter of the through-hole 1a at the lower surface (second surface) of the insulator 1 is 3 μm or greater and 15 μm or less. The average thickness of the metal plated layer 2 formed on both sides of the insulator 1 in the above described metal plated layer forming step is 8 μm or greater and 12 μm or less.

In the method for manufacturing the printed wiring board, the above described through-hole forming step gradually decreases the inside diameter of the through-hole 1a from the upper surface (first surface) toward the lower surface (second surface) of the insulator 1, while controlling the average diameter of the through-hole 1a at the upper and lower surfaces of the insulator to fall within the above described range. Further, in the method for manufacturing the printed wiring board, the metal plated layer forming step controls the average thickness of the metal plated layer 2 formed on both sides of the insulator 1 to fall within the above described range. In the method for manufacturing the printed wiring board, because the average diameter of the through-hole 1a at the upper and lower surfaces of the insulator, and the average thickness of the metal plated layer 2 formed on both the upper and lower surfaces of the insulator 1, are set within the above described ranges, the above described metal plated layer forming step can close the end portion of the through-hole 1a on the lower surface side by the plating metal, and successively fill the plating metal into the through-hole 1a from the lower surface side of the through-hole 1a while preventing the formation of voids. In the method for manufacturing the printed wiring board, because the average diameter of the through-hole 1a at the upper and lower surfaces of the insulator is set to fall within the above described range, it is possible to reduce the stress concentration at the fringe portions of the inner peripheral surface of the through-hole 1a. Accordingly, the method for manufacturing the printed wiring board can manufacture a printed wiring board in which the deterioration in the durability and the conductivity is reduced, and the generation of voids is prevented.

Through-Hole Forming Step

The above described through-hole forming step forms the through-hole 1a, that penetrates from the upper surface (first surface) to the lower surface (second surface) of the plate-shaped, sheet-shaped, or film-shaped base forming the insulator 1, by the laser beam machining, for example. The above described through-hole forming step irradiates the laser beam from the upper surface side of the base, so that the inside diameter of the through-hole 1a gradually decreases from the upper surface (first surface) toward the lower surface (second surface) of the insulator 1. The shape and size of the through-hole 1a formed by the above described through-hole forming step are the same as those of the through-hole 1a of the printed wiring board illustrated in FIG. 1.

Metal Plated Layer Forming Step

The above described metal plated layer forming step includes a process (electroless plating step) of electroless-plating on both sides of the insulator 1, and on the inner peripheral surface of the through-hole 1a formed in the insulator 1, and a process (electroplating step) of electroplating using the electroless plated layer 2a formed by the above described electroless plating step as the adherend. Hence, it is possible to form the dense and uniform metal plated layer 2 in which the electroplated layer 2b is laminated on the electroless plated layer 2a, at a relatively low cost and with ease.

Other Embodiments

The embodiments disclosed herein should be considered to be illustrative in all respects and not restrictive. The scope of the present invention is not limited to the configuration of the above embodiments, but is set forth by the appended claims, and is intended to include all modifications within the meaning and scope of the present invention and equivalents thereof.

For example, in the case where the metal plated layer fills the through-hole, the first surface side of the region where the metal plated layer fills the through-hole does not need to cave in. In addition, in the case where the region where the metal plated layer fills the through-hole caves in, the method for manufacturing the printed wiring board may include a process of planarizing the metal plated layer on the first surface side of the insulator so as to remove the cave-in of the metal plated layer.

The shape of the inner peripheral surface of the through-hole in the cross section along the thickness direction of the insulator is not limited to the shape of the above described embodiment.

In the printed wiring board, the metal plated layer may be patterned to form the desired wiring pattern, by forming the electroplated layer on the entire surface of the electroless plated layer, that is, by forming the metal plated layer on both sides of the insulator in their entirety, and then laminating the resist pattern to selectively removing the metal plated layer by etching.

In the printed wiring board, the electroless plated layer may be omitted, and instead, a thin conductive underlayer may be formed on both sides of the insulator and on the inner peripheral surface of the through-hole, by vapor deposition, sputtering, coating and baking an ink that includes conductive particles, or the like, for example, and the metal plated layer may be formed by electroplating using the thin conductive underlayer as the adherend.

In the above described forming step, a through-hole may be formed in the insulator by means other than the laser beam.

DESCRIPTION OF THE REFERENCE NUMERALS

1 Insulator
1a Through-Hole
2 Metal Plated Layer
2a Electroless Plated Layer
2b Electroplated Layer
2c Cave-In Portion
3 First Metal Layer
4 Second Metal Layer
5 Through-Hole

The invention claimed is:

1. A printed wiring board comprising:
an insulator having a first surface, and a second surface opposite to the first surface, and including a through-hole penetrating from the first surface to the second surface; and
a metal plated layer formed on the first surface and the second surface of the insulator, and on an inner peripheral surface of the through-hole,
wherein the metal plated layer fills an inside of the through-hole, and a surface of the metal plated layer caves in on the first surface side of a region where the metal plated layer fills the through-hole,
wherein the inner peripheral surface of the through-hole curves radially outward in a convex arc shape in a crass section of the insulator along a thickness direction thereof,
wherein an inside diameter of the through-hole gradually decreases from the first surface toward the second surface of the insulator,
wherein an average diameter of the through-hole at the first surface of the insulator is 20 μm or greater and 35 μm or less,
wherein the average diameter of the through-hole at the second surface of the insulator is 3 μm or greater and 15 μm or less, and
wherein an average thickness of the metal plated layer formed on the first surface and the second surface of the insulator is 8 μm or greater and 12 μm or less.

2. A method for manufacturing a printed wiring board, comprising:
a process of forming, in an insulator having a first surface, and a second surface opposite to the first surface, a through-hole penetrating from the first surface to the second surface; and
a process of forming a metal plated layer on the first surface and the second surface of the insulator, and on an inner peripheral surface of the through-hole,
wherein the process of forming the metal layer fills an inside of the through-hole with the metal plated layer, so that a surface of the metal plated layer caves in on the first surface side of a region where the metal plated layer fills the through-hole,
wherein the process of forming the through-hole includes gradually decreasing an inside diameter of the through-hole from the first surface toward the second surface of the insulator,
forming the through-hole to have an average diameter of 20 μm or greater and 35 μm or less at the first surface of the insulator, and
forming the through-hole to have the average diameter of 3 μm or greater and 15 μm or less at the second surface of the insulator, and
wherein the process of forming the metal plated layer forms the metal plated layer on the first surface and the second surface of the insulator to have an average thickness of 8 μm or greater and 12 μm or less, and
wherein the process of forming the through-hole forms the through-hole so that the inner peripheral surface of the through-hole curves radially outward in a convex arc shape in a cross section of the insulator along a thickness direction thereof.

* * * * *